United States Patent
Kettunen et al.

(10) Patent No.: US 8,781,432 B2
(45) Date of Patent: Jul. 15, 2014

(54) CIRCUIT COUPLING

(75) Inventors: Arttu Aukusti Kettunen, Oulu (FI); Marko Johannes Viitala, Kontio (FI)

(73) Assignee: Broadcom Corporation, Irvine, CA (US)

( * ) Notice: Subject to any disclaimer, the term of this patent is extended or adjusted under 35 U.S.C. 154(b) by 119 days.

(21) Appl. No.: 13/268,295

(22) Filed: Oct. 7, 2011

(65) Prior Publication Data

US 2013/0090148 A1 Apr. 11, 2013

(51) Int. Cl.
*H04B 1/28* (2006.01)

(52) U.S. Cl.
USPC ........................................... 455/333

(58) Field of Classification Search
USPC .......................... 455/338, 333, 334
See application file for complete search history.

(56) References Cited

U.S. PATENT DOCUMENTS

| | | | |
|---|---|---|---|
| 3,755,693 A | 8/1973 | Lee | 307/237 |
| 5,412,262 A | 5/1995 | Nishio et al. | 326/64 |
| 5,541,532 A | 7/1996 | McCall | 326/68 |
| 5,589,790 A | 12/1996 | Allen | 327/333 |
| 5,684,414 A | 11/1997 | Linebarger et al. | 326/75 |
| 6,253,332 B1 | 6/2001 | Hassan | 713/500 |
| 7,504,859 B2 | 3/2009 | Aoki | 326/68 |
| 7,649,381 B2 | 1/2010 | Yamashita et al. | 326/68 |
| 2002/0084824 A1* | 7/2002 | Cohn et al. | 327/309 |
| 2008/0018375 A1 | 1/2008 | Chen et al. | 327/333 |
| 2008/0218292 A1 | 9/2008 | Park et al. | 333/103 |

OTHER PUBLICATIONS

Feng Chen, "Implementing an SLVS Transceiver," May 26, 2011, Lattice Semiconductor Corp, Last Retreived Jul. 16, 2013 from http://www.edn.com/Pdf/ViewPdf?contentId=4368073; pp. 1-6.*
Chen, F., "Implementing an SLVS Transceiver", May 26, 2011, Lattice Semiconductor Corp., 4 pgs.

* cited by examiner

*Primary Examiner* — Christian Hannon
(74) *Attorney, Agent, or Firm* — Stanton IP Law

(57) ABSTRACT

An apparatus for coupling a baseband integrated circuit that uses a first signalling standard to a radio frequency integrated circuit that uses a second signalling standard includes a buffer coupled to the baseband integrated circuit and a resistor network coupled between the buffer and the radio frequency integrated circuit. The resistor network implements a voltage divider so as to convert a first voltage used by the baseband integrated circuit to a second voltage used by the radio frequency integrated circuit. The apparatus may be used in a mobile telecommunications device.

19 Claims, 6 Drawing Sheets

CIRCUIT COUPLING

TECHNICAL FIELD

The present invention relates to a coupling for integrated circuits. In particular, but not exclusively, the present invention relates to an apparatus and a method for coupling a baseband integrated circuit to a radio frequency integrated circuit wherein the two integrated circuits use different signalling standards. Apparatus according to the present invention may be used in mobile telecommunications devices.

BACKGROUND

Within mobile communications networks there is a trend towards ever faster over-the-air data rates. For example, General Packet Radio Service (GPRS) offers data rates of around 56 to 114 kilobits per second over the Global System for Mobile Communications (GSM), whereas next generation mobile broadband technologies such as Long Term Evolution (LTE) and Mobile Worldwide Interoperability for Microwave Access (WiMAX) and their descendants offer data rates of around 1 gigabit per second and higher.

Typically, higher data rates are enabled by developments in radio frequency signalling technology. For example, these developments may be embodied in new radio frequency integrated circuits that provide the necessary radio frequency signal processing. These new radio frequency integrated circuits may use newer physical interface standards, such as the fourth revision of the DigRF standard adopted by the MIPI Alliance. This in turn requires integrated circuits that interface with the new radio frequency integrated circuits to also be revised to use the newer physical interface standards. These may include baseband integrated circuits. This requires revisions to the manufacturing of mobile device integrated circuits and results in higher costs.

"Implementing an SLVS Transceiver" as published in issue 10 of EDN Magazine on 26 May 2011 describes Field Programmable Gate Array (FPGA) adaptations to provide an SLVS-compatible interface. A bespoke FPGA generates a modified Low-Voltage Differential Signalling (LVDS) signal that can be received by a Scalable Low-Voltage Signalling (SLVS) peer device.

It is thus desirable to be able to support higher data rates in mobile communications devices without complex components and at a low cost.

SUMMARY

In accordance with an exemplary embodiment, there is provided apparatus for coupling a baseband integrated circuit that uses a first signalling standard to a radio frequency integrated circuit that uses a second signalling standard, the apparatus comprising a buffer coupled to the baseband integrated circuit and a resistor network coupled between the buffer and the radio frequency integrated circuit, the resistor network implementing a voltage divider so as to convert a first voltage used by the baseband integrated circuit to a second voltage used by the radio frequency integrated circuit.

In accordance with an exemplary embodiment, there is provided apparatus for coupling a baseband integrated circuit that uses a first signalling standard to a radio frequency integrated circuit that uses a second signalling standard, the apparatus comprising a resistor network coupled between the baseband integrated circuit and the radio frequency integrated circuit, the resistor network implementing a voltage divider so as to convert a first voltage used by the baseband integrated circuit to a second voltage used by the radio frequency integrated circuit, the resistor network comprising a first resistor coupled between a voltage source and a first node, the first node being arranged to receive a signal from the baseband integrated circuit, a second resistor coupled between the first node and a second node, the second node being coupled to an input of the second integrated circuit and a third resistor coupled between the second node and ground. A coupling capacitor is coupled between the voltage source and the first resistor.

In accordance with an exemplary embodiment, there is provided a mobile communications device comprising a baseband integrated circuit for performing baseband processing of a signal, the baseband integrated circuit using a first signalling standard, a radio frequency integrated circuit for performing radio frequency processing of a signal, the radio frequency integrated circuit using a second signalling standard and an interface for coupling the baseband integrated circuit and the radio frequency integrated circuit. The interface comprises a buffer and a resistor network coupled to the output of the buffer, the resistor network implementing a voltage divider so as to convert a first voltage used by one of the baseband integrated circuit and the radio frequency integrated circuit to a second voltage used by the other of the baseband integrated circuit and the radio frequency integrated circuit.

In accordance with an exemplary embodiment, there is provided a method for communicating a data signal between a baseband integrated circuit that uses a first signalling standard and a radio frequency integrated circuit that uses a second signalling standard comprising receiving a data signal produced by one of the baseband integrated circuit and the radio frequency integrated circuit, buffering the data signal, adjusting a voltage of the data signal from a first voltage used by said one of the baseband integrated circuit and the radio frequency integrated circuit to a second voltage used by the other of the baseband integrated circuit and the radio frequency integrated circuit, and passing the data signal to an input of said other of the baseband integrated circuit and the radio frequency integrated circuit.

In accordance with an exemplary embodiment, there is provided an apparatus for coupling a baseband integrated circuit that uses a first signalling standard to a radio frequency integrated circuit that uses a second signalling standard, the apparatus comprising a buffer coupled to the radio frequency integrated circuit, the buffer being arranged to adjust a voltage of the data signal from a first voltage specified by the second signalling standard to a second voltage specified by the first signalling standard Further features and advantages of the invention will become apparent from the following description of preferred embodiments of the invention, given by way of example only, which is made with reference to the accompanying drawings.

DETAILED DESCRIPTION

Figure 1A:
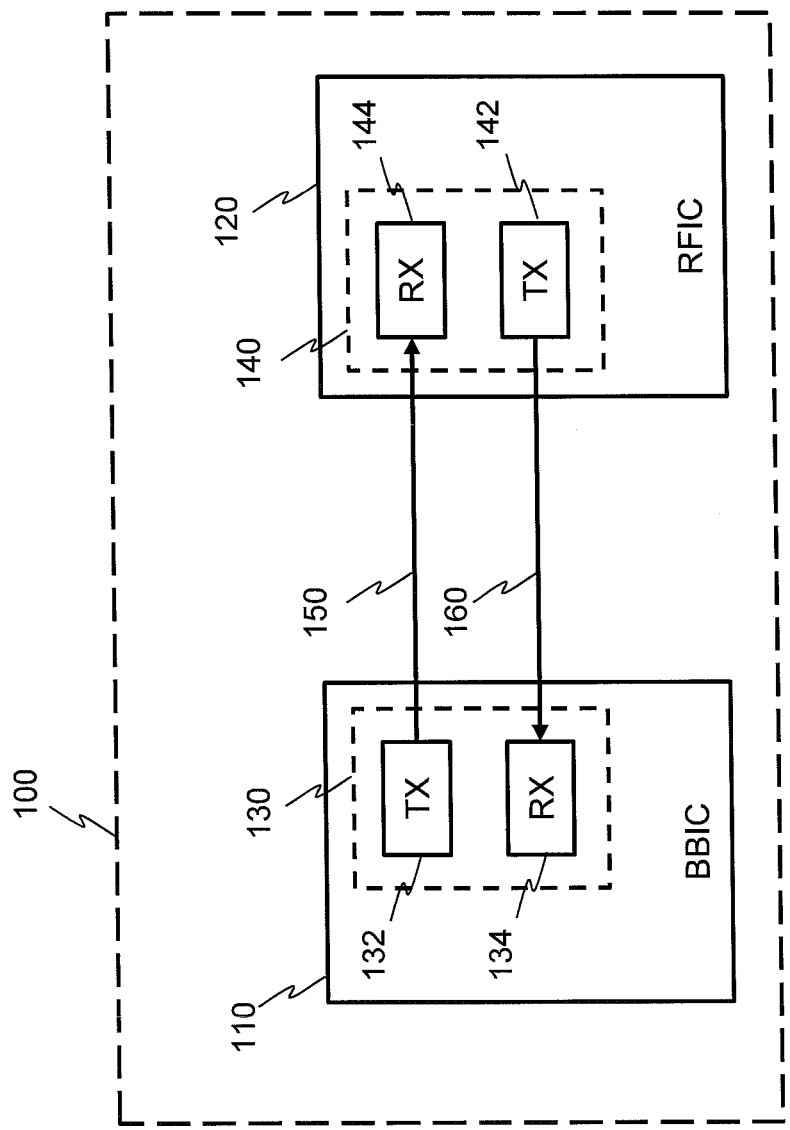
FIG. 1A is a simplified schematic diagram showing a baseband integrated circuit coupled to a radio frequency integrated circuit.

In certain embodiments an interface between a baseband integrated circuit that uses a first signalling standard and a radio frequency integrated circuit that uses a second signalling standard is provided. The signalling standards may relate to signals to be sent from, or received at, a particular physical hardware interface of a corresponding integrated circuit. The interface meets the required electrical specification of each signalling standard. It enables physical data transmission between the baseband integrated circuit and the radio frequency integrated circuit. Voltage levels of the interface signals are adjusted to meet a specified range with passive components and buffers. This simplifies the interface and is more cost-efficient than solutions that require separate, custom-made application-specific integrated circuits (ASIC). Certain embodiments thus enable voltage levels of interface signals to be controlled such that a serial data link between a baseband integrated circuit and a radio frequency integrated circuit is functional in both transmit (TX) and receive (RX) directions.

If the second signalling standard uses lower voltage levels than the first signalling standard then small changes in the output of the baseband integrated circuit have the potential to cause any input received at the radio frequency integrated circuit to be outside of the second signalling standard. For example, what may be a small fluctuation at the relatively high voltage levels of the baseband integrated circuit may be a large fluctuation at the relatively low voltage levels of the radio frequency integrated circuit. Hence, in order for the resistor network to accurately convert the voltage levels, baseband integrated circuits would typically have to very closely match the first signalling standard with little deviation from the standard. This would restrict the baseband integrated circuits that could be used, typically to more expensive or newer circuits. However, by using an apparatus with a buffer, these strict requirements for the baseband integrated circuit are relaxed, i.e. buffering reduces the requirements for a baseband integrated circuit transceiver. Using one or more buffers along with passive components makes certain embodiments easy to implement in various applications without additional requirements for baseband integrated circuits. In certain variations the baseband integrated circuit uses a Low-Voltage Differential Signalling (LVDS) standard and the radio frequency integrated circuit uses a Scalable Low-Voltage Signalling (SLVS) standard. For example, the radio frequency integrated circuit may have a physical interface configured according to the DigRFv4 standard, which forms part of MIPI Alliance's M-PHY standard. DigRFv4 supports high data rates with low power consumption making it especially attractive for use in mobile devices. Certain embodiments thus offer a fast and cost-efficient physical DigRFv4 interface between radio frequency and baseband integrated circuit that may be implemented with general components. Without the apparatus the radio frequency integrated circuit cannot be connected to existing LVDS hardware. This in turn means that existing baseband processing hardware can be reused with newer radio frequency signalling technologies, reducing waste and costs.

In certain embodiments, the resistor network comprises a first resistor coupled between a voltage source and a first node, the first node being coupled to an output of the buffer, a second resistor coupled between the first node and a second node, the second node being coupled to an input of the second integrated circuit and a third resistor coupled between the second node and ground. This provides a simple implementation using passive components.

In certain embodiments the apparatus forms part of one of two signalling lines in a differential signalling system, the differential signalling system coupling the baseband integrated circuit to the radio frequency integrated circuit. A second apparatus, or an additional part of the same apparatus, may supply similar components, e.g. a buffer and a resistor network, on the second of the two signalling lines.

In certain embodiments the resistance values of a plurality of resistors in the resistor network are selected to match a line impedance of the coupling between the baseband integrated circuit and the radio frequency integrated circuit. The resistance values may also be selected to match the electrical specification of the appropriate parts of both the first and second signalling standards.

In certain embodiments a voltage source is coupled to the resistor network via a coupling capacitor. The coupling capacitor prevents a drain current passing through the resistor network and thus reduces the power consumption of the apparatus. This is useful for mobile devices that have limited battery power.

FIG. 1A shows an exemplary mobile device 100 comprising a baseband integrated circuit 110 and a radio frequency integrated circuit 120. The baseband integrated circuit 110 may be configured to perform baseband processing; for example, on either a signal to be modulated and transmitted or on a signal that has been received and demodulated. Baseband processing may comprise, amongst others, encoding and decoding, error correction, data formatting, and bit manipulation. The radio frequency integrated circuit 120 may be configured to perform radio frequency processing; for example, to modulate a baseband signal received from the baseband integrated circuit for transmission using a carrier wave or to demodulate a received signal ready for baseband processing and decoding.

The interface between a baseband integrated circuit and a radio frequency integrated circuit forms a crucial part of any wireless communication device. In FIG. 1A, the baseband integrated circuit 110 comprises a transmitting component (TX) 132 for transmitting a signal over communication link 150 to a receiving component 144 of the radio frequency integrated circuit 120. In FIG. 1A, baseband integrated circuit 110 also comprises a receiving component 134 for receiving a signal over communication link 160 from a transmitting component 142 of the radio frequency integrated circuit 120. The transmitting component 132 and receiving component 134 of the baseband integrated circuit 110 may collectively comprise a physical port or interface 130 of the baseband integrated circuit 110. Likewise, the transmitting component 142 and receiving component 144 of the radio frequency integrated circuit 120 may collectively comprise a physical port or interface 140 of the radio frequency integrated circuit 120.

In the present embodiment, the baseband integrated circuit 110 has a physical interface 130 that meets a first signalling standard; in this case the Low-Voltage Differential Signalling (LVDS) standard, which has a nominal peak-to-peak voltage of 700 mV. The radio frequency integrated circuit 120 has a physical interface 140 that meets a second signalling standard; in this case the DigRFv4 standard as developed by the MIPI Alliance. The DigRFv4 standard in turn uses Scalable Low-Voltage Signalling (SLVS) standard with a nominal peak-to-peak voltage of 200 mV (i.e. SLVS-200). Hence, the two integrated circuits have input/output (I/O) interfaces defined by different I/O signalling standards. In the present embodiment, the use of LVDS and SLVS-200 are provided as example, in other embodiments an alternative first and/or second signalling standard may be used.

Figure 1B:
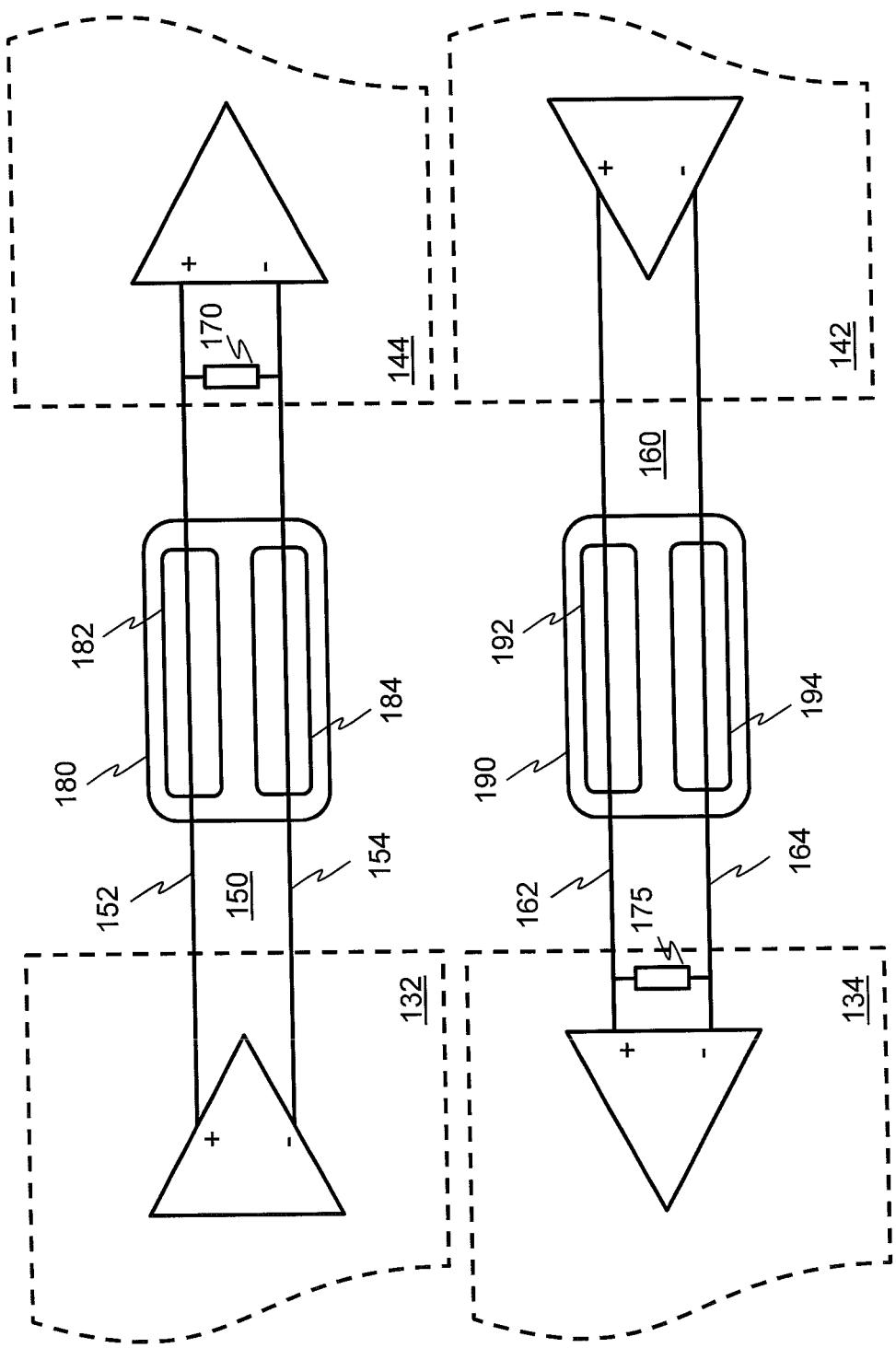
FIG. 1B is a simplified schematic diagram showing an apparatus for coupling a baseband integrated circuit to a radio frequency integrated circuit according to an embodiment.

FIG. 1B shows communication links 150 and 160 in more detail. In the example of FIG. 1B, the transmitting component 132 of the baseband integrated circuit 110 is coupled to the receiving component 144 of the radio frequency integrated circuit 120 using a differential signalling system. In the differential signalling system two transmission lines 152 and 154 are provided. The transmission lines 152 and 154 are terminated by a resistive load, provided in FIG. 1B by resistor 170. In this example a 100 Ohm resistor is used. This is chosen to match the characteristic impedance of the transmission links, which is typically 50 Ohms per link. In some implementations the load resistor may be integrated in the receiving component. The transmission lines 152, 154 and resistor 170 provide a wire loop. As in this example, the baseband integrated circuit uses the LVDS standard and so produces a voltage signal with a 700 mV nominal peak-to-peak voltage. As a data signal to be transmitted over the communication link 150 changes state, e.g. a digital binary signal toggling from 1 to 0 or vice versa, the polarity of a differential voltage signal generated over the communication link 150 changes, which may be detected by the receiving component 144. For example, the baseband integrated circuit may generate an LVDS voltage signal with a +/−350 mV voltage swing on top of a 1.25V common-mode voltage.

FIG. 1B shows an apparatus 180 that may form part of communication link 150 and that acts to convert a signal produced according to the first signalling standard to a signal that may be received by a component that utilises the second signalling standard. The apparatus 180 may comprise two components: a first component 182 to be used in relation to the first differential transmission link 152 and a second component 184 to be used in relation to the second differential transmission link 154. Alternate single-ended embodiments may also be implemented, in which case only one of transmission link 152 and first component 182 or transmission link 154 and second component 184 may be used.

FIG. 1B also shows an apparatus 190 that may form part of communication link 160. In the example of FIG. 1B, the transmitting component 142 of the radio frequency integrated circuit 120 is coupled to the receiving component 134 of the baseband integrated circuit 110 using a differential signalling system. The differential signalling system is similar to the system that implements communication link 150: two transmission lines 162 and 164 are provided and these are terminated by a resistive load in the form of resistor 175. Apparatus 190 acts to convert a signal produced according to the second signalling standard to a signal that may be received by a component that utilises the first signalling standard.

Figure 2A:
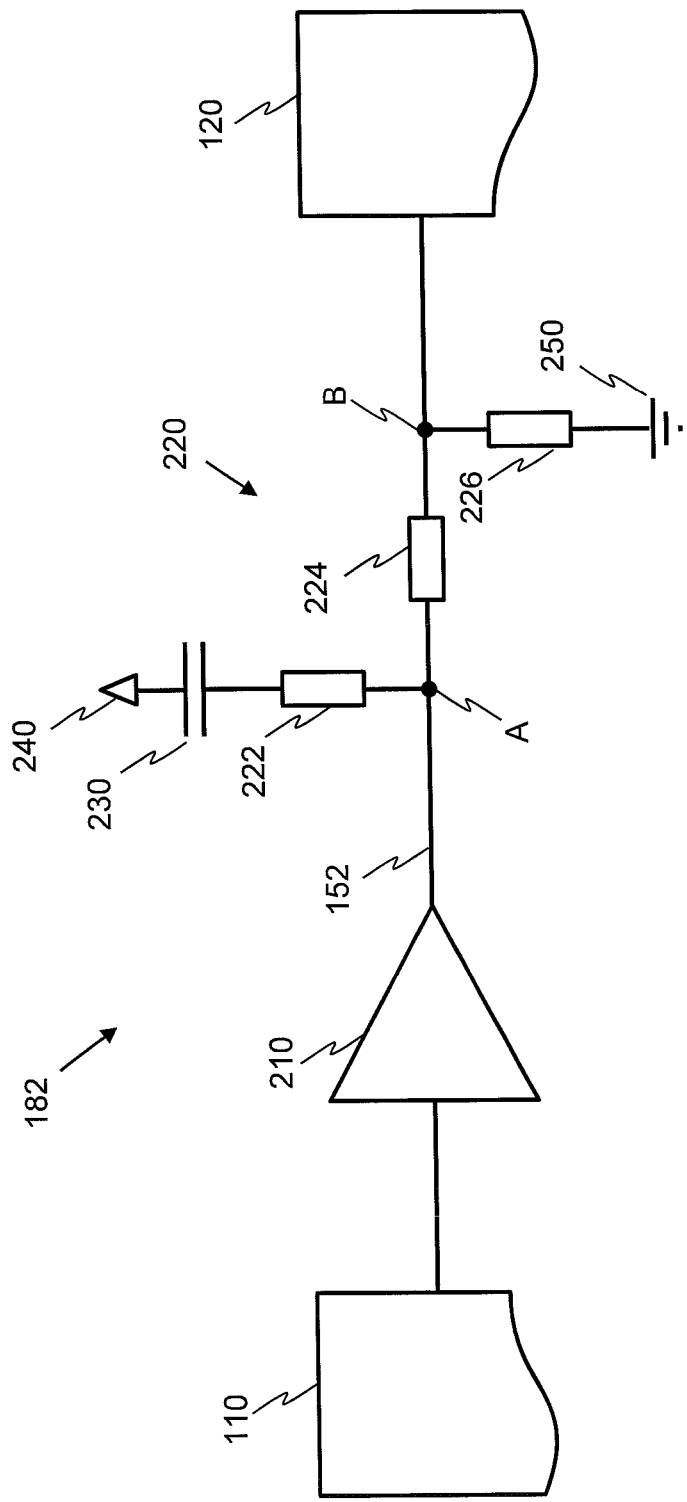
FIG. 2A is a simplified schematic diagram showing a number of components that implement a single-ended coupling for the apparatus of FIG. 1B.

FIG. 2A shows the configuration of the first component 182 in more detail. A similar configuration may also be used for the second component 184. In FIG. 2A the two end integrated circuits are illustrated: baseband integrated circuit 110 comprising a transmitting component and radio frequency integrated circuit 120 comprising a receiving component. Any resistive loads, such as resistor 170, are omitted for clarity. The baseband integrated circuit 110, which may for example be a Field Programmable Gate Array (FPGA), has a LVDS interface that produces a signal according to this standard. The radio frequency integrated circuit 120, which may use a physical layer interface (PHY) according to the M-PHY standard, has an SLVS interface arranged to receive a signal according to this standard. A buffer 210 is coupled to the LVDS output of the baseband integrated circuit and a resistor network 220. The buffer may comprise a unity gain buffer amplifier or voltage follower. In this case the buffer acts to isolate the impedance seen at the input to the buffer, e.g. from the LVDS output, from the impedance seen at the buffer output, e.g. that is presented to the resistor network 220. In certain embodiments the buffer need not be a unity gain amplifier. The use of a buffer relaxes the requirements of the baseband integrated circuit interface, e.g. it enables existing baseband integrated circuits with LVDS interfaces to be used without modification. The buffer may be, for example, a DS25BR100 as supplied by National Semiconductor Corporation, used without pre-emphasis and without equalisation.

As described above, the buffer is connected in turn to resistor network 220. Resistor network 220 comprises a number of resistors, in this example three, that are provided along the transmission line 152 in order to convert a voltage level for the first signalling standard to a voltage level for the second signalling standard. In this case the resistor network 220 converts a LVDS voltage to a SLVS-200 voltage. FIG. 2A shows three resistors: a first resistor 222 with a resistance R1, a second resistor 224 with a resistance R2, and a third resistor 226 with a resistance R3. The first resistor 222 is coupled to a voltage source 240 supplying a voltage $V_{CC}$ via a direct current (DC) coupling capacitor 230. The DC coupling capacitor 230 prevents a DC current flow from the voltage source, thus reducing the power consumption of the apparatus 180. This is especially important for mobile devices where power consumption needs to be minimised so as to maximise the battery life for mobile operation. The DC coupling capacitor 230 also has a benefit that it does not add to the impedance of the transmission line. The first resistor 222 is then coupled to a first node A of the transmission line 152. The second resistor 224 is coupled between the first node A and a second node B. The third resistor 226 is coupled between the second node B and ground 250. The second node B is then coupled to the input of the radio frequency integrated circuit 120.

The resistor network 220 provides a voltage divider wherein a first alternating current (AC) or differential voltage seen at the first node A, $V_{A\text{-}AC}$, is related to a second alternating current or differential voltage seen at the second node B, $V_{B\text{-}AC}$, via the equation:

$$V_{B\text{-}AC} = (R_3/(R_2+R_3)) * V_{A\text{-}AC}$$

(wherein, in this example, $V_{A\text{-}AC}$ and $V_{B\text{-}AC}$ both represent a peak-to-peak voltage swing, e.g. +/−X mV). The resistance values $R_1$, $R_2$ and $R_3$ are selected to match the characteristic line impedance $Z_0$ of the transmission line at the first node A, for example according to the equation:

$$Z_0 = R_1 \| (R_2+R_3), \text{ i.e. } (R_1*(R_2+R_3))/(R_1+(R_2+R_3))$$

wherein the first resistor is seen to be in parallel with the resistor pairing of the second and third resistors. The DC voltage at the first node A is calculated using the equation:

$$V_A = ((R_2+R_3)/(R_1+R_2+R_3)) * V_{CC}$$

and the DC voltage at the second node B is calculated using the equation:

$$V_B = ((R_3)/(R_1+R_2+R_3)) * V_{CC}.$$

The values of $V_{A\text{-}AC}$ and $V_A$ are set by the first signalling standard. The values of $V_{B\text{-}AC}$ and $V_B$ are set by the second signalling standard. The value of $Z_0$ depends on the properties of the transmission line; often it is approximated to 50 or 60 Ohms. The values of $R_1$, $R_2$, $R_3$ and $V_{CC}$ are then chosen such that the above equations are satisfied. When using commercial components values may be selected that provide the best approximate match to the specifications set by the signalling standards.

For one particular implementation environment using LVDS as the first signalling standard and SLVS-200 as the second signalling standard: $V_{A\text{-}AC}$=350 mV and $V_A$=1.34 V; $V_{B\text{-}AC}$=86 mV and $V_B$=0.327 V; and $Z_0$=48.6Ω. Hence, values of $R_1$=120Ω, $R_2$=61.8Ω, $R_3$=20Ω and $V_{CC}$=3.3 V may be used. These values are provided as an example based on one optimized value set for a particular implementation environment, different values may be used for different implementation environments and/or different signaling standards. They demonstrate how different signaling standards may use different AC and/or DC voltage levels.

Figure 4:
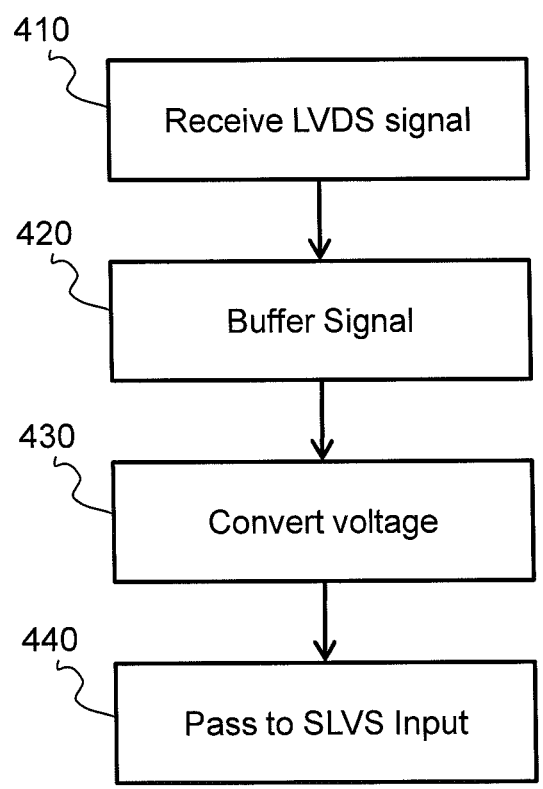
FIG. 4 is a flow diagram illustrating an exemplary method for sending a signal from a baseband integrated circuit to a radio frequency integrated circuit according to an embodiment.

FIG. 4 shows an exemplary method for physical data transmission between a baseband integrated circuit that uses a first signalling standard and a radio frequency integrated circuit that uses a second signalling standard. In this example, the first signalling standard is LVDS and the second signalling standard is SLVS-200 as set by M-PHY of the DigRFv4 standard. The method may be used with the apparatus of the preceding Figures. At step 410 an LVDS signal is received from the baseband integrated circuit. At step 420 the signal is buffered. At step 430 a voltage of the signal is converted, in this case the voltage may be converted from a single line voltage of 350 mV to a line voltage of 200 mV. At step 440 the converted voltage is passed to the SLVS input of the radio frequency integrated circuit. A similar method may also be provided for converting an SLVS output into an LVDS input, the voltage levels being accordingly adjusted.

The above embodiments are to be understood as illustrative examples of the invention. Further embodiments of the invention are envisaged.

Figure 2B:
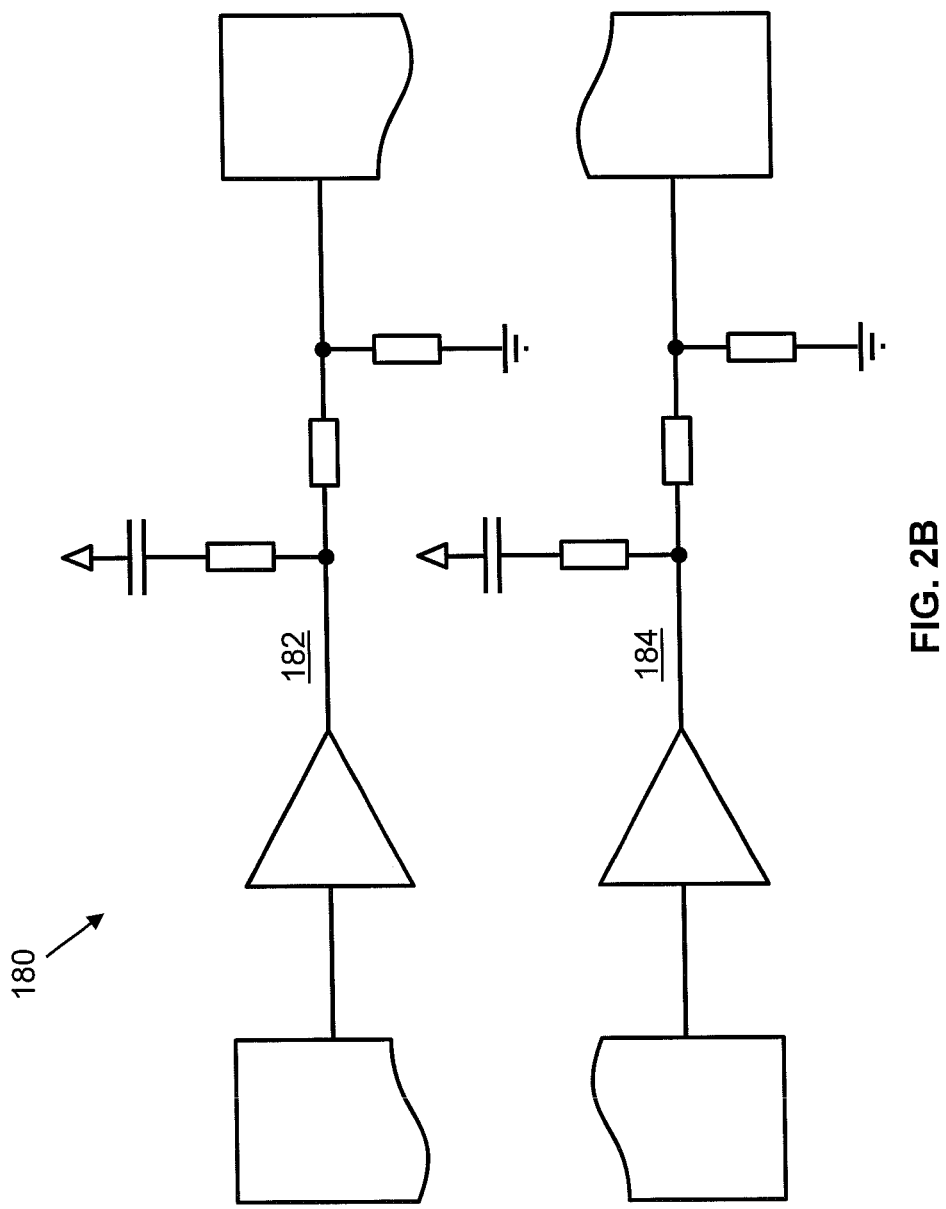
FIG. 2B is a simplified schematic diagram showing an exemplary differential coupling for the apparatus of FIG. 1B.

For example, FIG. 2B shows one embodiment of apparatus 180 wherein the second component 184 shares the same configuration as the first component 182.

Figure 3:
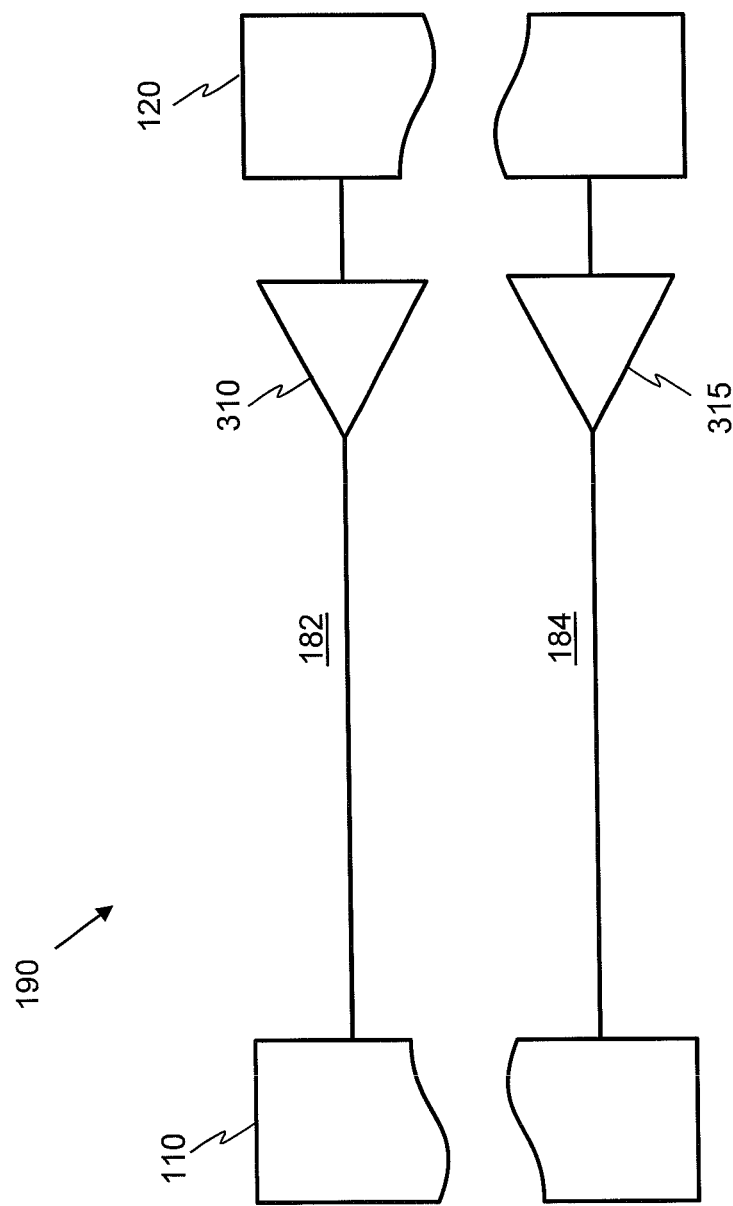
FIG. 3 is a simplified schematic diagram showing an exemplary coupling for a receive direction.

As another example, FIG. 3 shows a variation for apparatus 190. In certain embodiments, apparatus shares the same basic configuration as apparatus 180, for example the configurations shown in FIG. 2A or FIG. 2B. This enables the same basic configuration to be used in both transmit and receive directions. In other embodiments, such as the embodiment shown in FIG. 3, an alternative configuration is used for communications between the radio frequency integrated circuit 120 and the baseband integrated circuit 110. In FIG. 3, a buffer 310 similar to buffer 210 is provided. The buffer 310 is configured to additionally amplify, i.e. provide a voltage gain for, a signal from the radio frequency integrated circuit 120. The buffer 310 is configured to amplify this signal meeting the second signalling standard to a voltage level that meets the first signalling standard. Hence, the buffer output signal, for a signal originating from the radio frequency integrated circuit 120, is at a correct level for the baseband integrated circuit 110 and a resistor network is not needed. This embodiment for the baseband integrated circuit receive direction thus reduces the component count and is more cost-efficient. In certain embodiments, apparatus 180 and apparatus 190 may be provided as a single integrated interface apparatus.

Embodiments of the present invention may be implemented in mobile devices. As used herein mobile devices include mobile or cell phones (including so-called "smart phones"), personal digital assistants, pagers, tablet and laptop computers, content-consumption or generation devices (for music and/or video for example), etc. Embodiments of the present invention may also be implemented within wireless devices. "Wireless devices" include in general any device capable of connecting wirelessly to a network, and includes in particular mobile devices as described above as well as fixed or more static devices, such as personal computers, game consoles and other generally static entertainment devices, various other domestic and non-domestic machines and devices, etc. The term "user equipment" is often used to refer to wireless devices in general, and particularly mobile wireless devices, hence, embodiments may be implemented with such "user equipment".

It will be understood that the circuitry referred to herein may in practice be provided by a single chip or integrated circuit or plural chips or integrated circuits. The term "coupled" is used to denote both a direct coupling, e.g. a conductive trace between two components, and an indirect coupling, e.g. an electrical connection that may incorporate one or more intermediate electronic components. Likewise the term "coupled between" may denote a direct coupling, e.g. conductive traces on either side of a component connected to each of two other components, or an indirect coupling, e.g. the component may be coupled between the two other components together with one or more additional electronic components.

Although the present embodiments have been described in the context of a coupling between a baseband integrated circuit and a radio frequency integrated circuit, they may also be adapted for use in other M-PHY implementations, for example for a first and second integrated circuit in any one of display, camera, audio, video, and memory couplings or power management systems. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. Apparatus for coupling a baseband integrated circuit that uses a first signaling standard to a radio frequency integrated circuit that uses a second signaling standard, the apparatus comprising:
    a buffer, disposed along a transmission line between the baseband integrated circuit and the radio frequency integrated circuit; and
    a resistor network coupled between the buffer and the radio frequency integrated circuit, the resistor network implementing a voltage divider so as to convert a first voltage used by the baseband integrated circuit to a second voltage used by the radio frequency integrated circuit;
    wherein the buffer operates to isolate an impedance at an input to the buffer from the resistor network.

2. The apparatus of claim 1, wherein the baseband integrated circuit uses a Low-Voltage Differential Signaling (LVDS) standard and the radio frequency integrated circuit uses a Scalable Low-Voltage Signaling (SLVS) standard.

3. The apparatus of claim 1, wherein the resistor network comprises:
    a first resistor coupled between a voltage source and a first node, the first node being coupled to an output of the buffer;
    a second resistor coupled between the first node and a second node, the second node being coupled to an input of the radio frequency integrated circuit; and
    a third resistor coupled between the second node and ground.

4. The apparatus of claim 3, comprising a coupling capacitor coupled between the voltage source and the first resistor.

5. The apparatus of claim 1, wherein the apparatus forms part of one of two signaling lines in a differential signaling system, the differential signaling system coupling the baseband integrated circuit to the radio frequency integrated circuit;
and wherein the buffer operates to relax requirements of the first signaling standard concerning outputs from the baseband integrated circuit.

6. The apparatus of claim 1, wherein resistance values of a plurality of resistors in the resistor network are selected to match a line impedance of the coupling between the baseband integrated circuit and the radio frequency integrated circuit.

7. Apparatus for coupling a baseband integrated circuit that uses a first signaling standard to a radio frequency integrated circuit that uses a second signaling standard, the apparatus comprising:
a buffer disposed along a transmission line between the baseband integrated circuit and the radio frequency integrated circuit;
a resistor network coupled between the buffer and the radio frequency integrated circuit, the resistor network implementing a voltage divider so as to convert a first voltage used by the baseband integrated circuit to a second voltage used by the radio frequency integrated circuit, the resistor network comprising:
a first resistor coupled between a voltage source and a first node, the first node being arranged to receive a signal from the baseband integrated circuit;
a second resistor coupled between the first node and a second node, the second node being coupled to an input of the second integrated circuit; and
a third resistor coupled between the second node and ground; and
a coupling capacitor coupled between the voltage source and the first resistor, performing impedance matching for low-voltage differential signaling;
wherein the buffer operates to isolate an impedance at an input to the buffer from the resistor network.

8. The apparatus of claim 7, wherein the baseband integrated circuit uses a Low-Voltage Differential Signaling (LVDS) standard and the radio frequency integrated circuit uses a Scalable Low-Voltage Signaling (SLVS) standard.

9. The apparatus of claim 7, wherein the apparatus forms part of one of two signaling lines in a differential signaling system, the differential signalling signaling system coupling the baseband integrated circuit to the radio frequency integrated circuit;
and wherein the buffer operates to relax requirements of the first signaling standard concerning outputs from the baseband integrated circuit.

10. A mobile communications device comprising:
a baseband integrated circuit for performing baseband processing of a signal, the baseband integrated circuit using a first signaling standard;
a radio frequency integrated circuit for performing radio frequency processing of a signal, the radio frequency integrated circuit using a second signaling standard; and
an interface for coupling the baseband integrated circuit and the radio frequency integrated circuit, the interface comprising:
a buffer disposed along a transmission line between the baseband integrated circuit and the radio frequency integrated circuit; and
a resistor network coupled to the output of the buffer, the resistor network implementing a voltage divider so as to convert a first voltage used by one of the baseband integrated circuit and the radio frequency integrated circuit to a second voltage used by the other of the baseband integrated circuit and the radio frequency integrated circuit;
wherein the buffer operates to isolate an impedance at an input to the buffer from the resistor network.

11. The mobile communications device of claim 10, comprising a voltage source coupled to the resistor network via a coupling capacitor.

12. The mobile communications device of claim 10, wherein the buffer and resistor network form part of a first differential transmission line, a second differential transmission line comprising a further buffer and a further resistor network.

13. The mobile communications device of claim 10, wherein the baseband integrated circuit uses a Low-Voltage Differential Signaling (LVDS) standard and the radio frequency integrated circuit uses a Scalable Low-Voltage Signaling (SLVS) standard.

14. A method for communicating a data signal between a baseband integrated circuit that uses a first signaling standard and a radio frequency integrated circuit that uses a second signaling standard comprising:
receiving a data signal output from one of the baseband integrated circuit and the radio frequency integrated circuit;
buffering the data signal using a buffer disposed along a transmission line between the baseband integrated circuit and the radio frequency integrated circuit while isolating an impedance seen at an input to the buffer from an output of the buffer;
adjusting a voltage of the buffered data signal from a first voltage used by said one of the baseband integrated circuit and the radio frequency integrated circuit to a second voltage used by the other of the baseband integrated circuit and the radio frequency integrated circuit; and
passing the data signal to an input of said other of the baseband integrated circuit and the radio frequency integrated circuit.

15. The method of claim 14, comprising:
applying a voltage source to the resistor network via a coupling capacitor.

16. Apparatus for coupling a baseband integrated circuit that uses a first signaling standard to a radio frequency integrated circuit that uses a second signaling standard, the apparatus comprising: a buffer disposed along a transmission line between the baseband integrated circuit and the radio frequency integrated circuit, the buffer being arranged to adjust a voltage of the data signal from a first voltage specified by the second signaling standard to a second voltage specified by the first signaling standard, and the buffer being arranged to isolate an impedance seen at an input to the buffer from an impedance seen at an output of the buffer.

17. The method of claim 14, wherein the baseband integrated circuit uses a Low-Voltage Differential Signaling (LVDS) standard and the radio frequency integrated circuit uses a Scalable Low-Voltage Signaling (SLVS) standard.

18. The method of claim 14, wherein the method is performed on one of two signaling lines in a differential signaling system, the differential signaling system coupling the baseband integrated circuit to the radio frequency integrated circuit;
and wherein buffering the data signal while isolating the impedance is performed by a buffer that operates to relax requirements of the first signaling standard concerning outputs from the baseband integrated circuit.

19. The mobile communications device according to claim 10, wherein the interface forms part of one of two signaling lines in a differential signaling system, the differential signaling system coupling the baseband integrated circuit to the radio frequency integrated circuit;
and wherein the buffer operates to relax requirements of the first signaling standard concerning outputs from the baseband integrated circuit.

* * * * *

UNITED STATES PATENT AND TRADEMARK OFFICE
CERTIFICATE OF CORRECTION

PATENT NO.         : 8,781,432 B2
APPLICATION NO.    : 13/268295
DATED              : July 15, 2014
INVENTOR(S)        : Arttu Aukusti Kettunen et al.

It is certified that error appears in the above-identified patent and that said Letters Patent is hereby corrected as shown below:

In the Claims

Claim 9, column 9, line 45: Replace "the differential signalling signaling system" with --the differential signaling system--.

Signed and Sealed this
Fourteenth Day of October, 2014

Michelle K. Lee
*Deputy Director of the United States Patent and Trademark Office*